United States Patent
Iriguchi

(10) Patent No.: US 7,255,968 B2
(45) Date of Patent: Aug. 14, 2007

(54) ALIGNMENT METHOD OF EXPOSURE MASK AND MANUFACTURING METHOD OF THIN FILM ELEMENT SUBSTRATE

(75) Inventor: Chiharu Iriguchi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/223,956

(22) Filed: Sep. 13, 2005

(65) Prior Publication Data

US 2006/0068304 A1 Mar. 30, 2006

(30) Foreign Application Priority Data

Sep. 27, 2004 (JP) .............................. 2004-280043

(51) Int. Cl.
*G03F 9/00* (2006.01)
(52) U.S. Cl. .............................. 430/22; 430/1; 430/30; 356/401; 359/12; 359/15; 359/35
(58) Field of Classification Search .................. 430/1, 430/22, 30; 359/12, 15, 35; 356/401

See application file for complete search history.

(56) References Cited

U.S. PATENT DOCUMENTS 6,329,104 B1 * 12/2001 Clube et al. ................... 430/1

OTHER PUBLICATIONS

Francis Cube, et al., "P-40: 0.5 μm Enabling Lithography for Low-Temperature Polysilicon Displays", SID 03 Digest, 2003, pp. 350-353.
Ali Reza Nobari, et al., "Magnification Compensating 0.4 μm Exposure System for Peripheral ICs", IDW'04, pp. 765-766.

* cited by examiner

*Primary Examiner*—Christopher G. Young
(74) *Attorney, Agent, or Firm*—Oliff & Berridge, PLC

(57) ABSTRACT

A method for aligning an exposure mask comprises: using a plurality of hologram masks, on which an alignment mark is formed; aligning position of the hologram masks toward an object to be exposed and on which an alignment mark is also formed, with a plurality of times by using both alignment marks; and pattern-exposing the object, wherein, while aligning at least three consecutive times, an alignment mark for third time aligning on the object is set in between alignment marks respectively for second time aligning and first time aligning, or at a position on an opposite side to a side in which the alignment mark for second time aligning is located with respect to the alignment mark for first time aligning.

8 Claims, 8 Drawing Sheets

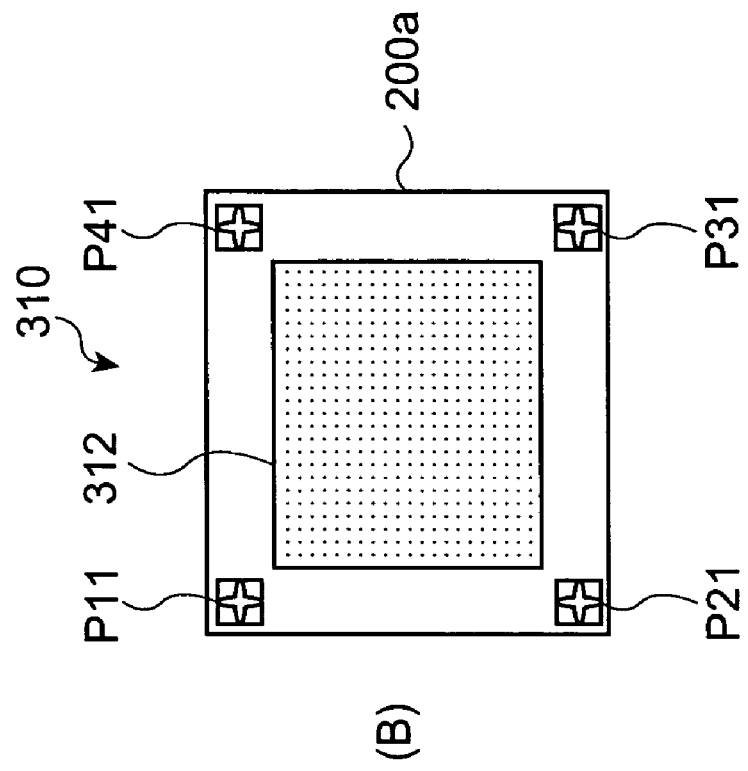
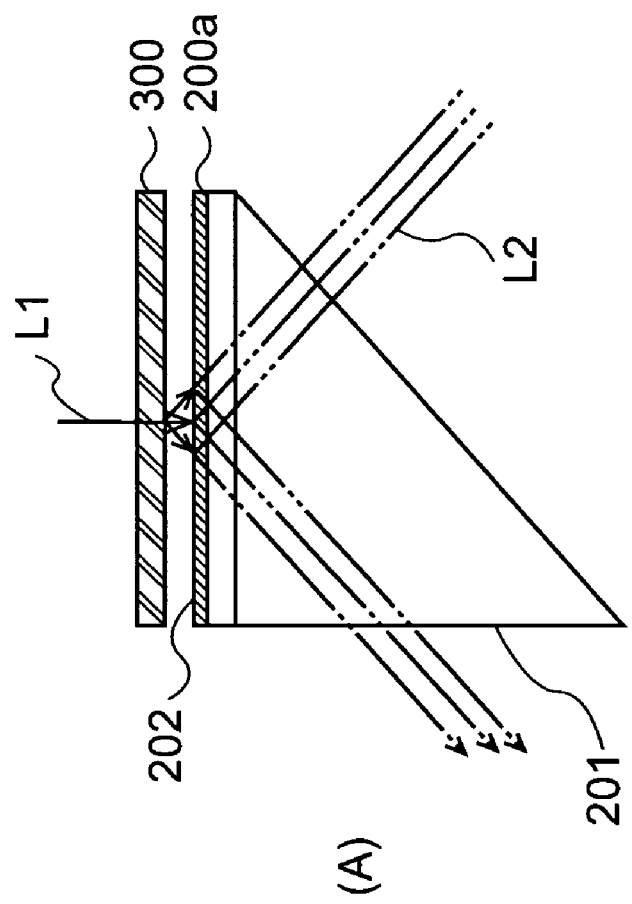
FIG. 3B
FIG. 3A

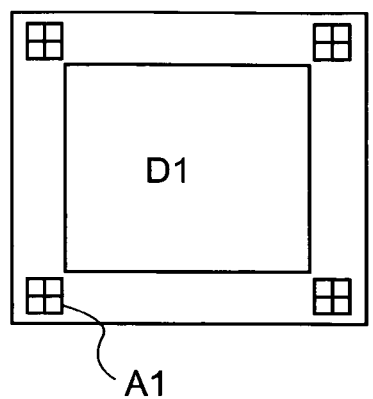
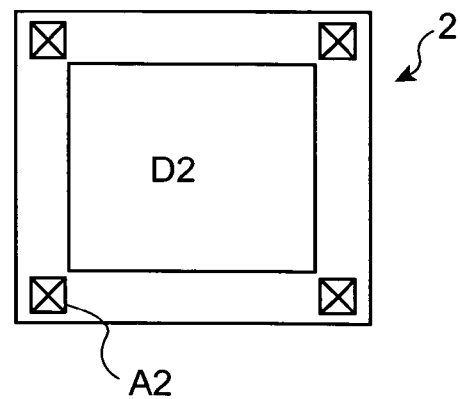
FIG. 7A    FIG. 7B
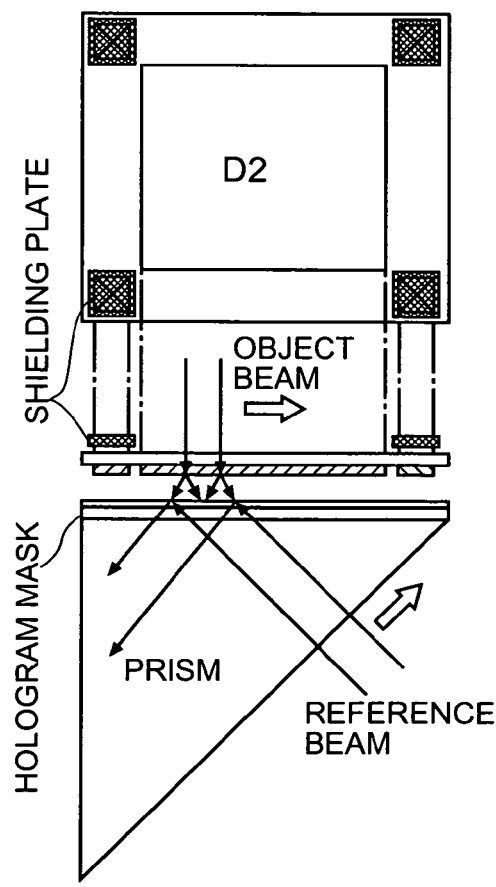
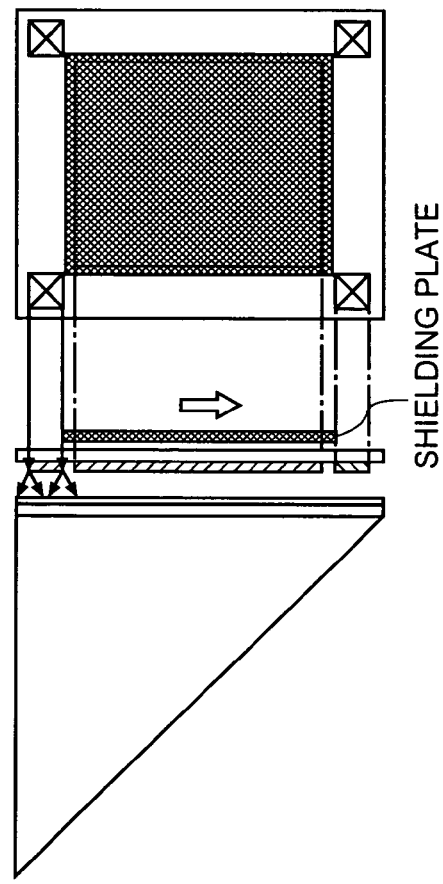
FIG. 8A    FIG. 8B

ALIGNMENT METHOD OF EXPOSURE MASK AND MANUFACTURING METHOD OF THIN FILM ELEMENT SUBSTRATE

RELATED APPLICATION INFORMATION

This application claims priority to Japanese Application No. 2004-280043, filed Sep. 27, 2004, whose contents are expressly incorporated herein by reference.

BACKGROUND OF THE INVENTION

1. Technical Field

The invention relates to fine patterning using exposure technology such as hologram, and particularly, to a method of aligning an exposure mask to an object subject to exposure, and a manufacturing method of a thin film element substrate using that method.

2. Related Art

In recent years, holographic technology of a Total Internal Reflection (TIR) type has been a focus of attention in a patterning process of a semiconductor device. This exposure technology employs a recording process of recording a desired pattern with respect to a hologram mask by using a hologram exposure device, and an exposure process of exposing a photoresist for semiconductor patterning by irradiating reproduced light to this hologram mask.

In the recording process, a recording beam of laser is first irradiated to a mask pattern (former reticule) corresponding to a pattern of the semiconductor device to cause refracted light to generate and to be emitted to a recording surface of a hologram mask. On the other hand, reference light is irradiated from a reverse side of the hologram mask at a fixed angle with respect to the recording surface of the hologram mask, causing to interfere with the refracted light from a former reticule. This enables an interfering pattern to generate on the recording surface of the hologram mask and to record it on the hologram recording surface.

In the exposure process, the hologram mask is placed at the same position of the former reticule, then an exposure beam which is reproduced light is irradiated from a direction opposite to the time of recording, while the refracted light which reproduced the former pattern on the photoresist is utilized for image formation thereby to expose the photoresist. Normally, in this exposure process, the hologram mask is such that by matching an alignment mark formed on the side of a substrate, which will become an object subject to exposure, to an alignment mark formed on the side of a hologram mask, alignment of the substrate to the hologram mask is carried out.

In case of carrying out patterning using a plurality of hologram masks, currently available procedures were to align the hologram masks to the substrate by using a substrate, on which alignment marks were respectively formed, to a position corresponding to each alignment mark formed on each of the plurality of hologram masks. Symposium of Image Display (SID) 03 Digest, P—40, pp. 350-353 is an example of related art.

However, there was a problem of a need of alignment marks corresponding to the number of hologram masks on the substrate side. This problem increases the number of alignment marks as the number of hologram masks used increased, as calling for a wide area on the substrate to form alignment marks.

While the alignment mark to be incorporated in such hologram mask for the hologram exposure device is prepared separately from a device area, it is necessary to set up a gap of some 5 mm with respect to the device area and the alignment marks for other hologram masks (other layers) (refer to FIG. 7 and FIG. 8).

FIGS. 7A and B are schematic plans respectively showing a first layer mask and a second layer mask which are original Cr-made masks (former reticules) for making masks for hologram. As shown in FIG. 7A, on a first layer mask 1 there are provided a first layer device area D1 located in a center and first layer alignment marks A1 at four corners. Further, as shown in FIG. 7B, on a second layer mask 2 there are provided a second layer device region D2 and second layer alignment marks A2 at the four corners. A1 and A2 have different mark patterns.

FIGS. 8A and B are schematic, structural drawings showing respective processes when recording the device area and when recording alignment marks at the hologram mask (second layer mask). As shown in FIG. 8A, when recording the device area, recording on the hologram mask is carried out by object beams through the device area D2 and reference beams through prisms, with four alignment marks A2 of an original Cr mask 2 in a condition of its shielding plates closed.

On the other hand, as shown in FIG. 8B, when recording the alignment marks, recording on the hologram mask is carried out by object beams through four alignment marks A2 of the original Cr mask 2, with the device area D2 in a condition of its shielding plate closed. On the hologram mask made herein, it is such that the mask is made with respective gaps of some 5 mm between the alignment marks and the device area. It should be noted that though not illustrated, in case of providing the alignment mark and alignment marks of other layers on the same mask, respective gaps of some 5 mm will be set up for providing them.

FIG. 9 is a schematic, structural drawing for explaining a method of aligning currently available exposure masks. As shown in FIG. 9, in a currently available case where there are many masks to be exposed such as a first layer mask (L1), a second layer mask (L2) . . . a seventh layer mask (L7), in view of necessity to maintain a minimum allowable gap between alignment marks on the same mask, alignment marks on the object such as a substrate, AL2-1, AL3-2, AL4-3, AL5-4, AL6-5, and AL7-6, with respective gaps of about 5 mm, are provided sequentially in the same placement direction for each alignment. It should be noted that in the drawing, masks are overlaid, one on top of the other, for the sake of explanation, whereas the actual alignment is carried out per mask between the upper layer side mark recorded on the hologram mask and the lower layer side mark recorded on the object. In such case where there are many masks to be exposed, an area, on which a device on the object can be prepared, significantly decreases in size.

SUMMARY

In view of the above problem, the invention is intended to provide a method of aligning an exposure mask which can reduce an area necessary for an alignment mark of an object while maintaining a minimum allowable gap among alignment marks for the same exposure mask, and a method of manufacturing a thin film element substrate based on use thereof.

The invention achieves the above-referenced advantage by providing a method for aligning an exposure mask described below.

According to a first aspect of the invention, a method for aligning an exposure mask includes: using a plurality of hologram masks, on which an alignment mark is formed, aligning position of the hologram masks toward an object, which is exposed and on which an alignment mark is also formed, a plurality of times by using both alignment marks. While aligning at least three consecutive times, an alignment mark for third time aligning on the object is set in between alignment marks respectively for second time aligning and first time aligning, or at a position on an opposite side to a side in which the alignment mark for second time aligning is located with respect to the alignment mark for first time aligning.

According to this aspect, it is possible to reduce an area necessary for alignment marks of the object, while maintaining the minimum allowable gap among alignment marks on the same exposure mask.

Further, a method for aligning an exposure mask of the invention has the following other aspects and features.

According to a second aspect of the invention, a method for aligning an exposure mask includes: using a plurality of hologram masks, on which an alignment mark is formed, aligning position of the hologram masks toward an object, which is exposed and on which an alignment mark is also formed, a plurality of times by using both alignment marks. The alignment marks for an odd number of times aligning on the object and the alignment marks for an even number of times aligning are alternately positioned at respective placement areas.

According to such method, it is possible to reduce an area necessary for alignment marks of the object more efficiently.

The method of manufacturing a thin film element substrate using hologram exposure of the above aspects of the invention may further comprises carrying out patterning by exposing the object through irradiation of an exposure beam from above the hologram mask.

According to the above method, since it becomes possible to expand an area, which can be used for forming circuit patterns of the thin film element substrate employed for devices such as a semiconductor device, it becomes possible to provide devices, which are integrated in higher density.

The method of manufacturing a thin film element substrate using hologram exposure of the above aspects of the invention may further comprises recording a desired pattern including an alignment mark on the hologram mask; and carrying out patterning by exposing the object through irradiation of an exposure beam from above the hologram mask.

According to the above method, since it becomes possible to expand an area, which can be used for forming circuit patterns of the thin film element substrate employed for devices such as a semiconductor device, it becomes possible to provide devices, which are integrated in higher density.

The method of manufacturing a thin film element substrate of the above aspects of the invention may further comprise forming an alignment mark of the object when a first pattern is exposed on the object. According to this method, since it is not necessary to form alignment marks separately on the object, it becomes possible to decrease work processes, so that production efficiency may be improved.

According to the above aspects of the invention, there is provided a method of aligning an exposure mask which can reduce an area necessary for the alignment marks of the object while maintaining the minimum allowable gap among the alignment marks for the same exposure mask. Further, there can be provided a method of manufacturing a thin film element substrate, which can form a device integrated in high density.

BRIEF DESCRIPTION OF THE DRAWINGS

The invention will be described with reference to the accompanying drawings, wherein like numbers refer to like elements, and wherein;

FIG. 3 is a diagram for explaining a method of manufacturing a thin film element substrate according to the embodiment;

FIGS. 7A and B are schematic plan views showing an original Cr-made mask (former reticule) to prepare a hologram mask;

FIGS. 8A and B are schematic, structural diagrams showing respective processes when recording a device area and when recording alignment marks at the hologram mask (second layer mask)

DESCRIPTION OF THE EMBODIMENTS

Figure 1:
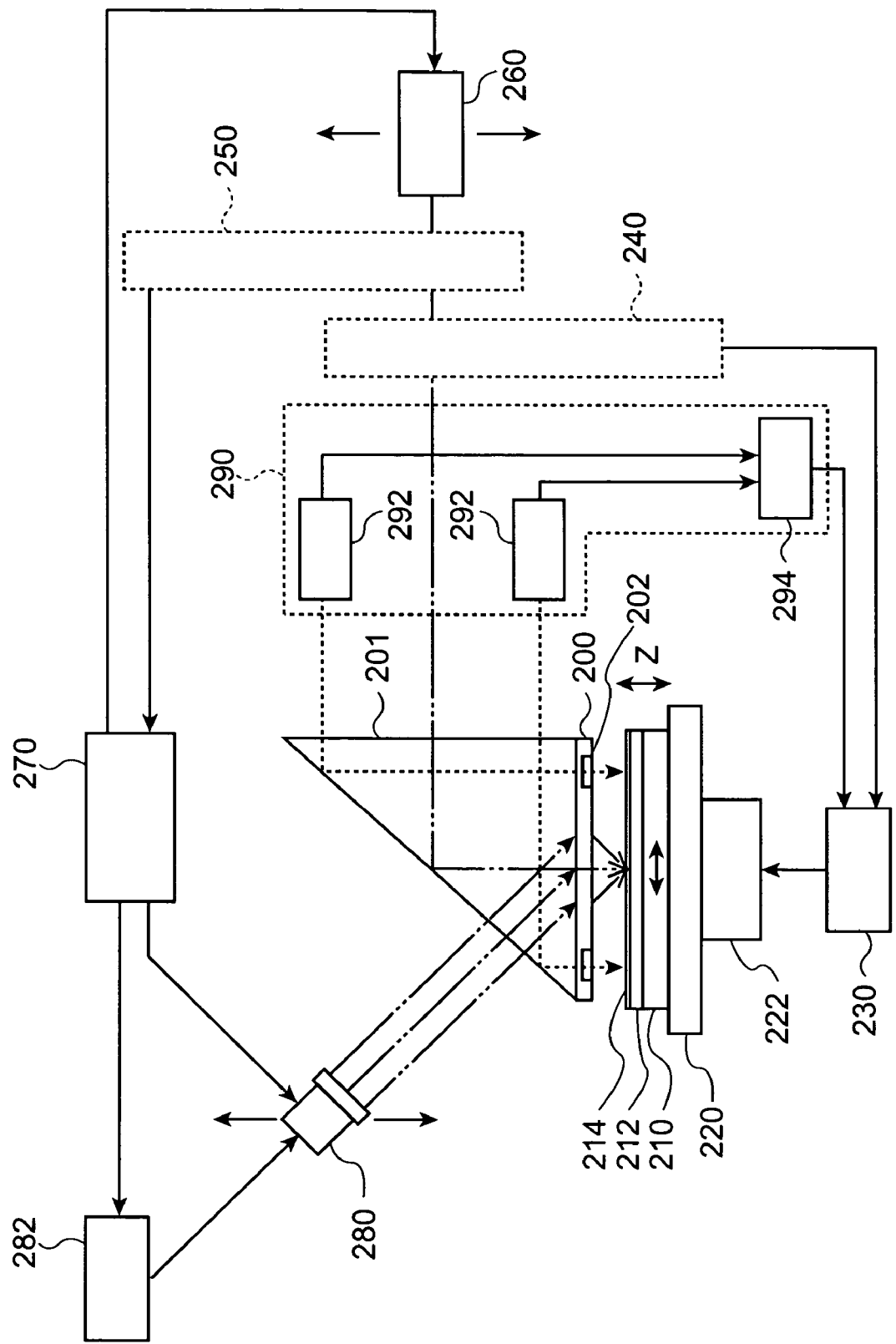
FIG. 1 is a diagram showing an entire configuration of a holographic exposure device for executing an alignment method of an exposure mask according to one embodiment of the invention.

Next, embodiments of the invention will be described with reference to the drawings. It should be noted that this invention is not limited to the following embodiments. FIG. 1 is a diagram showing an entire configuration of a holographic exposure device to carry out an alignment method of an exposure mask according to the embodiment.

As shown in FIG. 1, the exposure device is constituted mainly by a stage device 222 having a prism 201 and a stage 220, a first information processor 230, a range finding optical system 240, a film-thickness measurement optical system 250, a light source 260, a second information processor 270, an exposure light source 280, an exposure light source drive 282, and an alignment system 290.

The stage device 222 is made up such that positions of the stage 220 may be adjusted in an upward and downward direction (z direction) and in a horizontal direction (x direction) by holding, with a vacuum chuck and the like, a substrate subject to exposure 210 as an object subject to exposure, on which a photosensitive material film 212 is formed.

The light source 260 is constituted such that beams of light for measurement of the range finding optical system 240 and the film-thickness measurement optical system 250 may be emitted. The range finding optical system 240 is composed of a beam splitter, a cylindrical lens, an optical sensor, an error signal detector and the like and is constituted such that focusing at exposure time may be controlled by adjusting a distance between the hologram recording surface 202 and a photosensitive material film surface 214 coated on the substrate subject to be exposed.

A first information processor 230 is constituted such that a position of the stage 220 is set to bring into proper focus based on the distance between the hologram recording surface and the photosensitive material film surface coated on the substrate subject to be exposed, which is measured by the range finding optical system 240. The film-thickness measurement optical system 250 is composed of a beam splitter, a photo-detector, an amplifier, an A/D converter and the like and constituted so as to measure a film thickness of the photosensitive material film 212 formed on the substrate subject to exposure 210.

A second information processor 270 is constituted such that a quantity of light of exposure is controlled based on an absolute value of the film thickness of the photosensitive material film 212 which is outputted by the film-thickness measurement optical system 250, while, at the same time, moving the exposure light source 280, so that an exposure beam irradiated from the exposure light source 280 may scan within a proper exposure area.

The exposure light source 280 is constituted such that an exposure beam may be irradiated to the hologram recording surface 202 of the hologram mask 200. The exposure light source drive 282 is constituted such that a desired exposure area on the substrate subject to exposure 210 may be scanned and exposed by moving this exposure light source 280. Further, the exposure device is equipped with the prism 201 mounted with the hologram mask 200 on whose surface facing the exposure substrate subject to exposure 210 an interference pattern corresponding to a preset reticule pattern is recorded.

Further, the alignment system 290 is provided with an observation means to observe alignment marks and a positional slippage detection means to detect a positional slippage between an alignment mark of the hologram mask 200 and an alignment mark of the substrate subject to exposure 210.

In the embodiment, a microscope 292 as the observation means is for the purpose of observing an alignment mark formed on the substrate subject to exposure 210 through the hologram mask 200. The microscope 292 has a device for taking in images such as a CCD camera to take in images of alignment marks. Images of an alignment mark of the hologram mask 200 and an alignment mark of the substrate subject to exposure 210, which are observed by the microscope 292 and taken in by the device for taking in image, are converted to imagery signals and sent to a positional slippage detector 294 as a positional slippage detection means.

From imagery signals, the positional slippage detector 294 extracts characteristic points of the alignment mark of the hologram mask 200 and the alignment mark of the substrate subject to exposure 210 and calculates a distance between the characteristic points. For example, in a case where an alignment mark is formed in a cross shape on the substrate subject to exposure 210, while an alignment mark of a cross shape is formed on the hologram mask 200 side, for example, as characteristic points, an intersection of a letter + and an intersection of a letter X are respectively extracted, and a distance between the intersections is calculated. This information on the distance calculated is transmitted to the first information processor 230.

Further, the first information processor 230 is also constituted such that the stage device 222 may be moved in the x and y directions to set the position of the substrate subject to exposure 210 so as to decrease the distance between alignment marks (amount of alignment slippage). This enables the hologram mask 200 to be aligned to the substrate subject to exposure 210.

Figure 2:
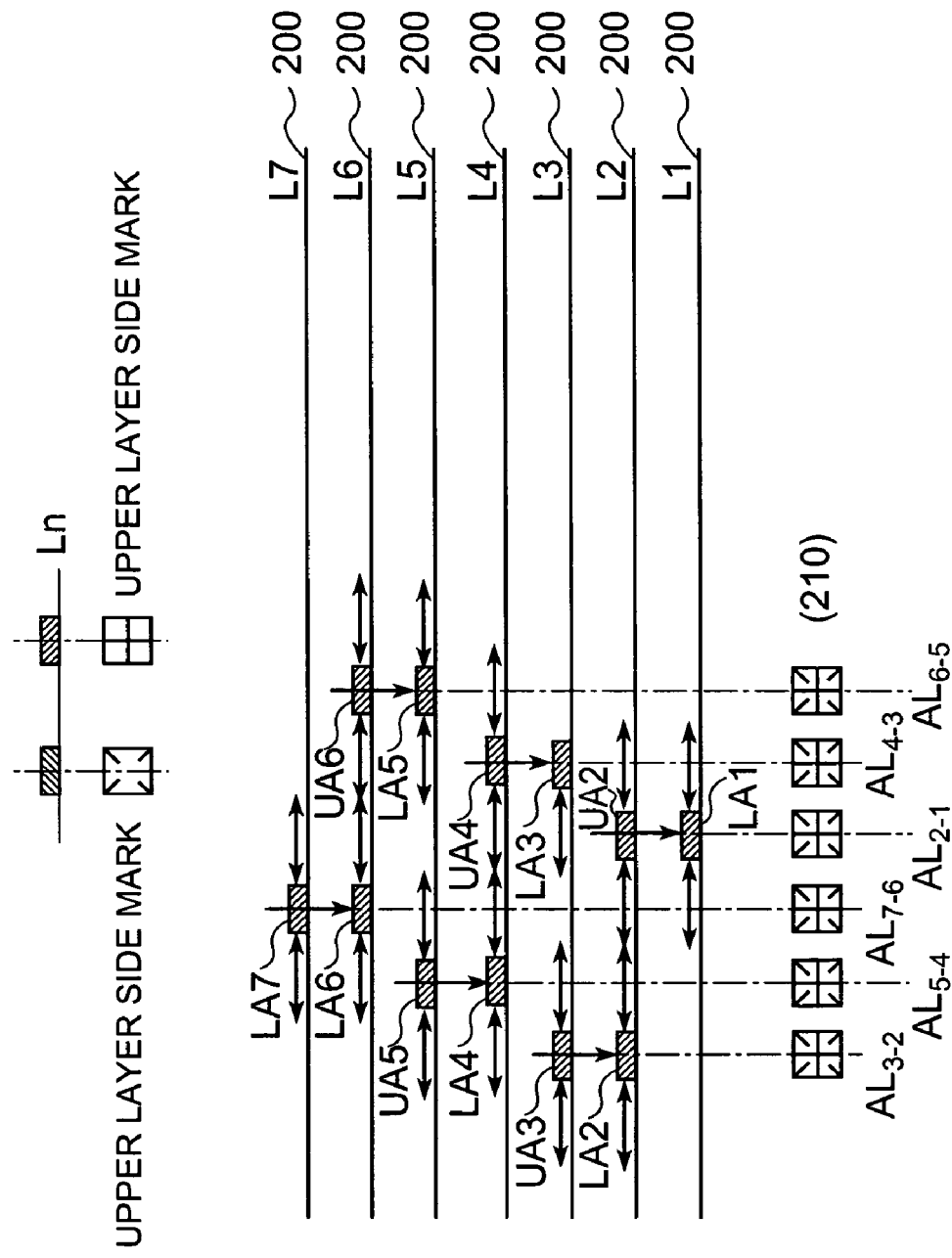
FIG. 2 is a diagram for explaining the alignment method of an exposure mask according to the embodiment.

And the alignment of the hologram mask 200 to the substrate subject to exposure 210 is carried out as shown in FIG. 2. As illustrated in FIG. 2, in the embodiment, the hologram mask 200 consists of a plurality thereof in a manner of a mask used for first layer exposure (hereinafter referred to as the "first layer mask" and the same to be applied hereinafter) (L1) which becomes subject to patterning on the substrate subject to exposure 210, a second layer mask (L2), a third layer mask (L3) . . . a seventh layer mask (L7).

First, at a preset area of the first layer mask (L1), an alignment mark LA1 for a lower layer side mark is set. When carrying out exposure of first layer patterning on the substrate subject to exposure 210, this enables an alignment mark (lower layer side mark) corresponding to LA2 to be also formed at a preset area other than the device area on the substrate subject to exposure 210.

For the second layer mask (L2) to be used next, an alignment mark (upper layer side mark) UA2, which is for the second layer mask itself to carry out alignment to the substrate subject to exposure 210, and an alignment mark LA2 for a lower layer side mark, which is for the third layer mask (L3) to carry out alignment to the substrate subject to exposure 210, are set with a fixed gap in between. And by verifying the alignment mark corresponding to the LA1 on the substrate subject to exposure 210, which was previously formed, with the UA2 on the second layer mask, first alignment is carried out.

After alignment of the second layer mask to the substrate subject to exposure 210, through exposure of second layer patterning on the substrate subject to exposure 210, the alignment mark (lower layer side mark) corresponding to the LA2 is jointly formed at a preset area other than the device area on the substrate subject to exposure 210. At this time, the alignment mark on the substrate subject to exposure 210 whose first alignment was carried out becomes an asterisk mark AL2-1 through exposure of the UA2. For the third layer mask (L3) to be used next, an alignment mark (upper layer side mark) UA3, which is for the third layer mask itself to carry out alignment to the substrate subject to exposure 210, and an alignment mark LA3, which is for a lower layer side mark for the third layer mask (L3) to carry out alignment to the substrate subject to exposure 210, are set with a fixed gap in between. Namely, in the embodiment, LA3 is set at a position in an immediate vicinity of the mark AL2-1 on the substrate subject to exposure 210, which was previously formed, such that a lower layer side mark may be formed. And, by verifying the alignment mark corresponding to the LA2 on the substrate subject to exposure 210, which was previously formed, with the UA3 on the third layer mask, a second alignment is carried out.

After alignment of the third layer mask to the substrate subject to exposure 210, through exposure of third layer patterning on the substrate subject to exposure 210, the alignment mark (lower layer side mark) corresponding to the LA3 is jointly formed at a preset area other than the device area on the substrate subject to exposure 210. At this time, the alignment mark on the substrate subject to exposure 210 whose second alignment was carried out becomes an asterisk mark AL3-2 through exposure of the UA3. For the fourth layer mask (L4) to be used next, in the same way as the third layer mask (L3), an alignment mark (upper layer side mark) UA4, which is for the fourth layer mask itself to carry out alignment with the substrate subject to exposure 210, and an alignment mark LA4, which is for a lower layer side mark for the fourth layer mask (L4) to carry out alignment with the substrate subject to exposure 210, are set with a fixed gap in between. Namely, in the embodiment, the LA4 is set at a position in an immediate vicinity of the mark AL3-2 on the substrate subject to exposure 210, which was previously formed, such that a lower layer side mark may be formed. And, by verifying the alignment mark corresponding to the LA3 on the substrate subject to exposure 210, which was previously formed, with the UA4 on the fourth layer mask, third alignment is carried out.

In regard to the fourth alignment by the fifth layer mask (L5) and the substrate subject to exposure 210, the fifth alignment by the sixth layer mask (L6) and the substrate subject to exposure 210, and the sixth alignment by the seventh layer mask (L7) and the substrate subject to exposure 210, the same procedures as the second and the third alignments may be used. In this manner, after the sixth alignment is carried out, asterisk marks AL2-1, AL3-2, AL4-3, A55-4, AL6-5, and AL7-6 are closely formed by exposure of seventh layer patterning on the substrate subject to exposure 210, as shown in FIG. 2, at a preset area other than the device area on the substrate subject to exposure 210. Namely, it is possible to form a gap less than the minimum allowable gap between two alignment marks on the same hologram mask 200. In this way, according to the embodiment, it is possible to reduce an area necessary for the alignment mark of the substrate subject to exposure 210.

Further, in the embodiment, in the above-referenced first to the sixth alignments, alignment is carried out by setting up the alignment marks (the lower layer side marks of the cross at positions corresponding to AL2-1, AL4-3, and AL6-5 shown in FIG. 2) for aligning the odd number of times, which are the first, the third, and the fifth times, on the substrate subject to exposure 210, and the alignment marks (the lower layer side marks of the cross at positions corresponding to AL3-2, AL5-4, and AL7-6 shown in FIG. 2) for aligning the even number of times, which are the second, the fourth, and the sixth times, on the substrate subject to exposure 210, at respective placement areas, that is, alternately, on a right side area and a left side area from the center of the area where the alignment marks for alignment are to be formed in FIG. 2. Consequently, it is possible to reduce efficiently an area necessary for the alignment marks on the substrate subject to exposure 210.

In the embodiment, for example, in consecutively aligning the first, the second, and the third times, alignment is carried out by setting up the alignment mark (lower layer side mark of the cross at the position corresponding to AL4-3) for aligning the third time on the substrate subject to exposure 210 at the side opposite to the side where the alignment mark (lower layer side mark of the cross at the position corresponding to AL3-2) for aligning the second time with respect to the alignment mark ((lower layer side mark of the cross at the position corresponding to AL2-1) for aligning the first time. However, it is possible to carry out alignment by setting it up in between (in FIG. 2, positions where AL5-4 and AL7-6 are located) the alignment marks (lower layer side marks of the cross at the positions respectively corresponding to AL3-2 and AL2-1) for aligning respectively the second time and the first time.

Further, for example, in aligning consecutively the second, the third, and the fourth times, alignment is carried out by setting up the alignment mark (lower layer side mark of the cross at the position corresponding to AL5-4) for aligning the fourth time on the substrate subject to exposure 210 in between the alignment marks (for aligning respectively the third time and the second time (lower layer side marks of the cross at the positions respectively corresponding to AL4-3 and AL3-2). However, it is possible to carry out alignment by setting it up at the side opposite (in FIG. 2, a position on the left side of AL3-2 having no mark) to the side where the alignment mark (lower layer side mark of the cross at the position corresponding to AL4-3) for aligning the third time with respect to the alignment mark (lower layer side mark of the cross at the position corresponding to AL3-2) for aligning the second time.

In the invention, it is not limited to the above-referenced embodiment so long as alignment is carried out by setting up an alignment mark for aligning the third time, while aligning at least three consecutive times, in between alignment marks respectively for the second time and the first time, or at a position on the opposite side to the side, where the alignment mark for the second time aligning is located with respect to the alignment mark aligning for the first time.

It should be noted that in FIG. 2, for the sake of explanation, a plurality of hologram masks 200 are illustrated, one layer laid over another, while in actual aligning, it is carried out per hologram 200 in between the upper layer side mark recorded on the hologram mask 200 and the lower layer side mark recorded on the substrate subject to exposure 210. In this manner, even in the case of a great number of hologram masks 200 to be exposed, while maintaining the minimum allowable gap between alignment marks on the same hologram mask, there will be no decrease of an area on which a device can be prepared on the substrate subject to exposure 210 that is the object.

Next, a manufacturing method of a thin film element substrate of the embodiment will be described with reference to FIG. 3 to FIG. 6.

First, first patterning (initial patterning) is carried out. As shown in FIG. 3A, on the hologram recording surface 202 of the hologram mask 200a bonded to the prism 201, for example, by using a first negative mask 300 made of Cr (also referred to as the "former reticule"), an interference stripe corresponding to a first reticule pattern is recorded. In the first reticule pattern, there is included at least a pattern corresponding to a thin film circuit having a thin film element in the targeted thin film element substrate.

Specifically, a beam to be recorded L1 (object light) is irradiated on the first negative mask 300 through which refracted light is obtained, and the refracted light is emitted to the hologram recording surface 202 of the hologram mask 200a. The beam to be recorded L1 through this first negative mask 300 and reference light L2, which is made to pass through the prism 201 from other directional side of the hologram recording surface 202 and which is irradiated, are caused to interfere with each other. This enables the interference stripe of a desired pattern to be recorded on the hologram recording surface 202.

FIG. 3B is a diagram showing an example of the hologram mask 200a on which a first interference stripe pattern 310 is formed. As shown in FIG. 3B, the first interference stripe pattern 310 includes an interference stripe pattern 312 corresponding to a first circuit pattern constituting the thin film circuit and interference stripe patterns P11, P21, P31, and P41 which become alignment marks.

Figure 4B:
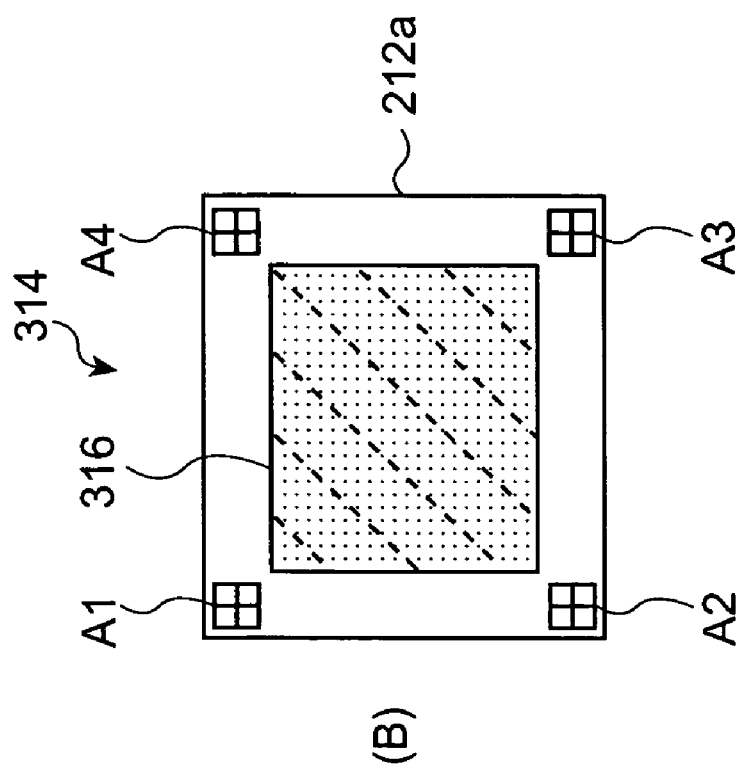
FIG. 4 is a diagram for explaining the method of manufacturing a thin film element substrate according to the embodiment.
Figure 4A:
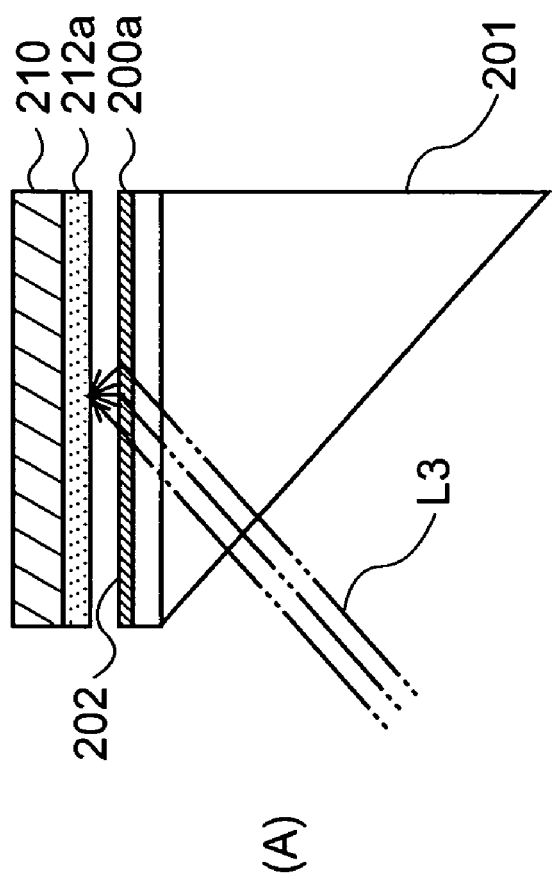

Next, as shown in FIG. 4A, there is placed the substrate subject to exposure 210 where a first photosensitive material film 212a in lieu of the negative mask 300 is formed at a position where the negative mask 300 was placed. Thereafter, the exposure beam L3 which is reproduced light is irradiated from a direction opposite to an incident side of the reference light L2 in FIG. 3A (the emitting side of the reference light L2) through the prism 201 onto the hologram recording surface 202, thereby exposing the first photosensitive material film 212a formed on the substrate subject to exposure 210. At this time, it should be noted that the hologram mask 200a is set to the prism 201 by changing a direction of the prism 201 such as to make a slant surface of the prism 201 face the incident side of the exposure beam L3. This enables a pattern 314 corresponding to the first interference stripe pattern 310 recorded on the hologram recording surface 202 to be formed on the substrate subject to exposure 210.

In FIG. 4B, there is shown an example of a pattern 314 to be formed by the first interference stripe pattern 310. As shown in FIG. 4B, there are formed alignment marks A1-A4 corresponding to the interference patterns P11, P21, P31, and P41 of the hologram mask 200a and the first circuit pattern 316 corresponding to the interference stripe pattern 312. Subsequently, necessary development and etching are processed to complete the first patterning.

Next, second patterning is carried out in the same way as the first patterning except for forming the position of alignment marks of the hologram mask by setting a preset gap.

The second patterning is carried out next. As shown in FIG. 5A, on the hologram recording surface 202 of the hologram mask 200b bonded to the prism 201, for example, by using a second negative mask 302 made of Cr, an interference stripe corresponding to a second reticle pattern is recorded. In the second reticle pattern, there is included at least a pattern corresponding to the thin film circuit having a thin film element in the thin film element substrate. The process of recording the interference stripe is carried out by the same method as the process of FIG. 3A, that is, by means of irradiation of the object light L1 and the reference light L2. At this time, alignment marks P13 and P23 for carrying out alignment of other hologram masks to the substrate subject to exposure 210 are also formed. Further, separately from this process of recording the interference stripe, by irradiating only the object light L1, the alignment marks P12, P22, P32, and P42 are formed on the hologram recording surface 202. The alignment marks P12-P42, and P13 and P23 have different purposes. Namely, the former refers to upper layer side marks for making alignment marks with respect to the first patterning, while the latter refers to lower layer side marks for making alignment marks with a so-called third layer hologram mask. Both are made separately according to the same method as the method shown in FIG. 8.

Figure 5B:
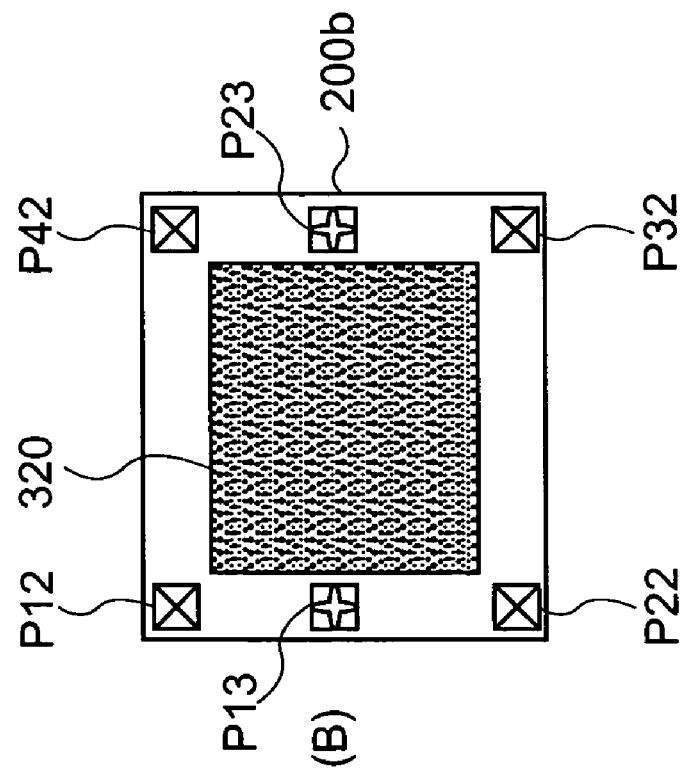
FIG. 5 is a diagram for explaining the method of manufacturing a thin film element substrate according to the embodiment.
Figure 5A:
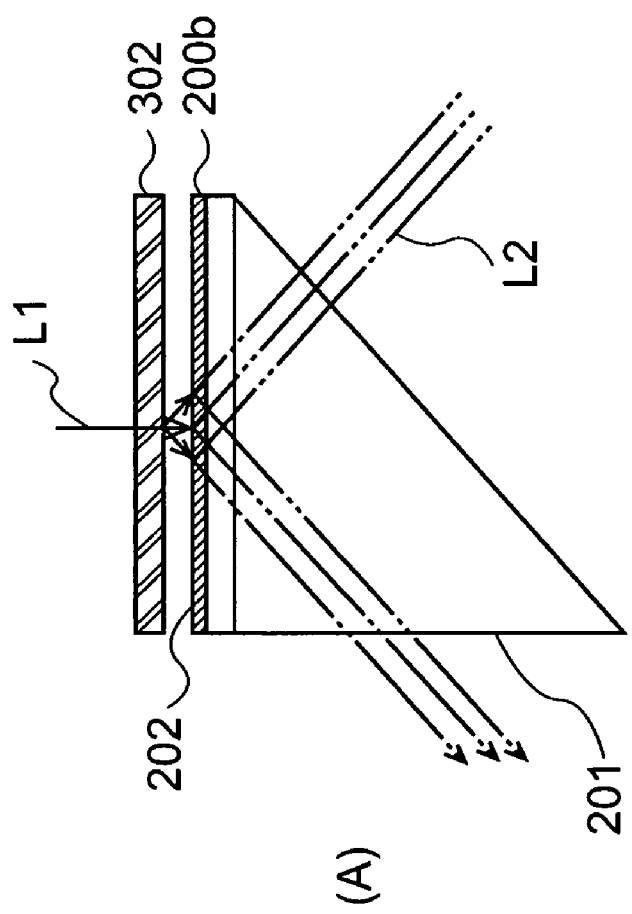

FIG. 5B is a diagram showing an example of the hologram mask 200b on which the second interference stripe pattern and the second alignment marks are formed. As shown in FIG. 5B, the second interference stripe pattern includes an interference stripe pattern 320 corresponding to a second circuit pattern constituting the thin film circuit. Further, there are formed at preset positions, at the four corners of the hologram mask 200b, the alignment marks P12, P22, P32, P42, P13, and P23 for carrying out alignment of this hologram mask 200b to the substrate subject to exposure 210.

Figure 6B:
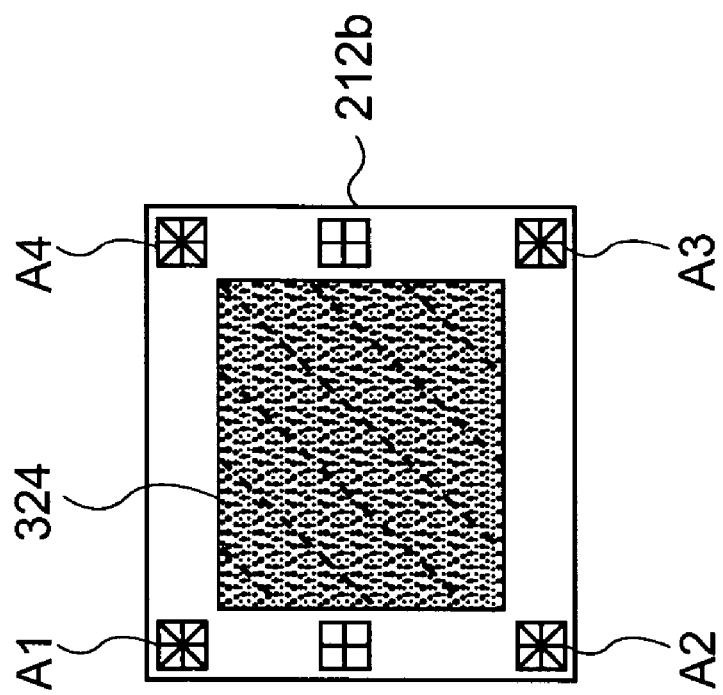
FIG. 6 is a diagram for explaining the method of manufacturing a thin film element substrate according to the embodiment.
Figure 6A:
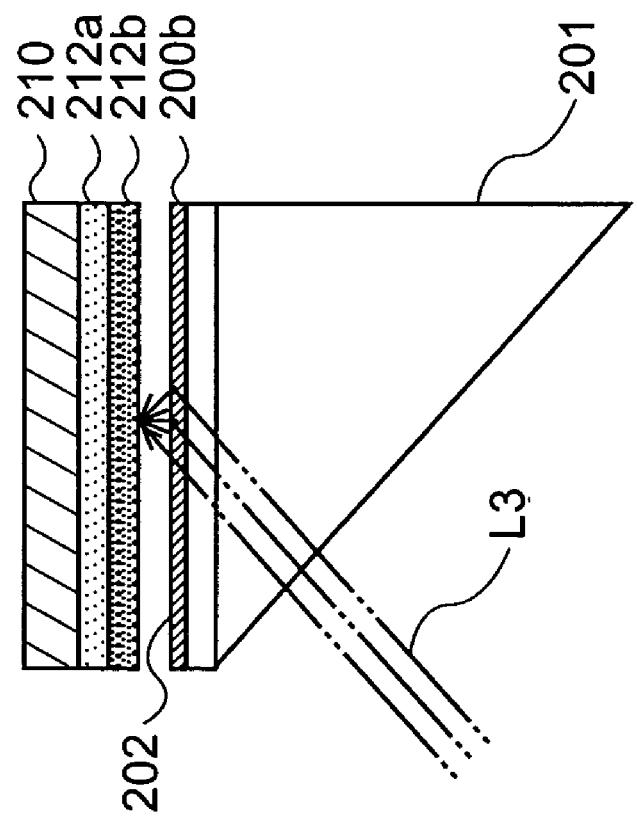
Figure 9:
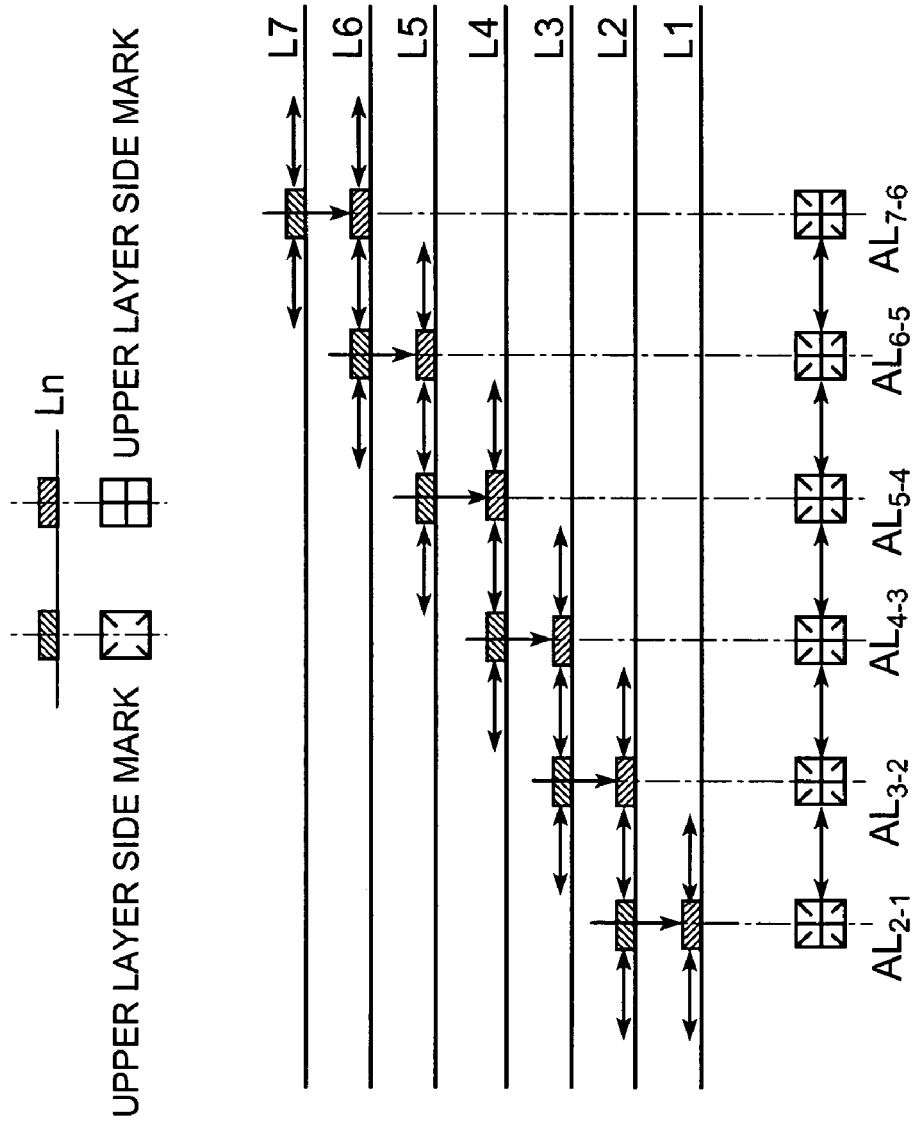
FIG. 9 is a schematic, structural diagram for explaining a currently available method of aligning an exposure mask.

Next, as shown in FIG. 6A, there is placed the substrate subject to exposure 210 where a second photosensitive material film 212b in lieu of the negative mask 302 is formed at a position where the negative mask 302 was placed. Thereafter, the exposure beam L3 is irradiated from the direction opposite to the reference light L2 in FIG. 5A (the emitting side of the reference light L2) through the prism 201 onto the hologram recording surface 202, thereby exposing the second photosensitive material film 212b. At this time, likewise, it should be noted that the hologram mask 200b is set to the prism 201 by changing the direction of the prism 201 such as to make the slant surface of the prism 201 face the incident side of the exposure beam L3.

The process will be explained more specifically. First, alignment of the substrate subject to exposure 210, on which the second photosensitive material film 212b is formed, to the hologram mask 200b is carried out by laying the alignment marks A1-A4 over the alignment marks P12, P22, P32, and P42 (FIG. 5B) formed on the hologram mask 200b. Specifically, as shown in FIG. 1, after setting the hologram mask 200b and the substrate subject to exposure 210 at preset positions, overlaid images of alignment marks of the hologram mask 200b and the substrate subject to exposure 210 are taken in through a vertical surface of the prism 201 by means of the microscope 292 set up at a position where each alignment mark is observed. The images taken in by the microscope 292 are transmitted as imagery signals to the positional slippage detector 294 and characteristic points are extracted from the images of overlaid alignment marks. For example, the positions of the intersection of the cross of the alignment mark A1 and the intersection of the letter X of the alignment mark P12 are extracted, whereby a distance between the intersections is calculated. This distance information is sent to the first information processor 230. So that this distance will diminish, the stage device 222 is driven to align the hologram 200b to the substrate subject to exposure 210.

Thereafter, the exposure beam L3 is irradiated to the hologram recording surface 202. There are formed alignment marks corresponding to the alignment marks P12, P22, P32, P42, and P13, and P23 of the hologram mask 200b, together with the second circuit pattern 324 corresponding to the interference stripe pattern 320 which is recorded on the hologram recording surface 202 (FIG. 6B). Subsequently, necessary development and etching are processed to complete the second patterning.

And, the alignment method as described above (refer to FIG. 2) is employed, the processes listed in FIG. 5 and FIG. 6 are repeated, and repetition of a third patterning, a fourth patterning . . . will enable the thin film element substrate according to the embodiment to be manufactured.

The manufacturing method of the thin film element substrate according to the invention may be applied to, for example, formation of a pixel circuit constituting each pixel in electro-chemical apparatus such as an EL display and a liquid crystal display, and a driver (integrated circuit) controlling the pixel circuit. Further, it is possible to be applied to manufacturing various devices other than the manufacture of such electro-chemical apparatus as well. For example, it is possible to manufacture each type of memory such as an FeRAM (ferroelectric RAM), an SRAM, a DRAM, an NOR RAM, an NAND RAM, a floating gate non-volatile memory, and a magnetic RAM (MRAM). Further, additionally, application is possible to cash dispensing cards and the like mounted with sensors and CPUs by using a thin film transistor (TFT). Furthermore, in a communications system of a non-contact type using microwaves, application is also possible in case of manufacturing inexpensive tags mounted with micro-circuit chips (IC chips).

The invention has industrial applicability as a method of aligning an exposure mask which can reduce an area necessary for alignment marks of an object while maintaining the minimum allowable gap among alignment marks on the same exposure mask and as a method of manufacturing a thin film element substrate which forms an integrated device in high density.

What is claimed is:

1. A method for aligning an exposure mask comprising:
   performing a first exposure to a substrate by using a first hologram mask to which a first pattern is formed;

performing a first alignment between the substrate and a second hologram mask by using a first alignment mark included in the first pattern formed on the substrate by the first exposure and a second alignment mark included in a second pattern that is formed on the second hologram mask and that includes a third alignment mark;

performing a second exposure to the substrate by using the second hologram mask;

performing a second alignment between the substrate and a third hologram mask by using the third alignment mark included in the second pattern formed on the substrate by the second exposure and a fourth alignment mark included in a third pattern that is formed on the third hologram mask and that includes a fifth alignment mark; and performing a third exposure to the substrate by using the third hologram mask, a distance between the second alignment mark included in the second pattern formed on the substrate by the second exposure and the third alignment mark included in the second pattern formed on the substrate by the second exposure being larger than a predetermined value, a distance between the fourth alignment mark included in the third pattern formed on the substrate by the third exposure and the fifth alignment mark included in the third pattern formed on the substrate by the third exposure being larger than the predetermined value, and a distance between the first alignment mark included in the first pattern formed on the substrate by the first exposure and the fifth alignment mark included in the third pattern formed on the substrate by the third exposure being smaller than the predetermined value.

2. A method for aligning an exposure mask according to claim 1, further comprising:

performing a fifth alignment between the substrate and a third hologram mask by using the fourth alignment mark included in the third pattern formed on the substrate by the third exposure and a sixth alignment mark included in a fourth pattern that is formed on the fourth hologram mask and that includes a seventh alignment mark; and performing a fourth exposure to the substrate by using the fourth hologram mask, these performings are repeated a multiple of times by using another hologram mask that is formed of a pattern different from the above pattern.

3. A method of manufacturing a thin film element substrate comprising:

carrying out alignment by using the method for aligning an exposure mask according to claim 1; and patterning by exposing the object through irradiation of an exposure beam from above said hologram mask.

4. A method of manufacturing a thin film element substrate comprising: carrying out alignment by using the method for aligning an exposure mask according to claim 2; and patterning by exposing the object through irradiation of an exposure beam from above said hologram mask.

5. A method of manufacturing a thin film element substrate comprising:

recording a desired pattern including an alignment mark to a hologram mask;

carrying out alignment by using the method for aligning an exposure mask according to claim 1; and patterning by exposing the object through irradiation of an exposure beam from above said hologram mask.

6. A method of manufacturing a thin film element substrate comprising:

recording a desired pattern including an alignment mark to a hologram mask;

carrying out alignment by using the method for aligning an exposure mask according to claim 2; and patterning by exposing the object through irradiation of an exposure beam from above said hologram mask.

7. The method of manufacturing a thin film element substrate according to claim 5, wherein an alignment mark of the object is formed when a first pattern is exposed on the object.

8. The method of manufacturing a thin film element substrate according to claim 6, wherein an alignment mark of the object is formed when a first pattern is exposed on the object.

* * * * *